US012712015B2

(12) United States Patent
Yoo et al.

(10) Patent No.: US 12,712,015 B2
(45) Date of Patent: Aug. 18, 2026

(54) MEMORY DEVICE AND MEMORY SYSTEM

(71) Applicant: SAMSUNG ELECTRONICS CO., LTD., Suwon-si (KR)

(72) Inventors: Hyeongjin Yoo, Suwon-si (KR); Wangsoo Kim, Suwon-si (KR); Junsub Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 149 days.

(21) Appl. No.: 18/653,285

(22) Filed: May 2, 2024

(65) Prior Publication Data

US 2025/0140309 A1 May 1, 2025

(30) Foreign Application Priority Data

Oct. 30, 2023 (KR) ........................ 10-2023-0146780

(51) Int. Cl.
*G11C 11/4099* (2006.01)
*G11C 5/10* (2006.01)
*G11C 11/4093* (2006.01)

(52) U.S. Cl.
CPC ............ *G11C 11/4099* (2013.01); *G11C 5/10* (2013.01); *G11C 11/4093* (2013.01)

(58) Field of Classification Search
CPC .... G11C 11/4099; G11C 5/10; G11C 11/4093
See application file for complete search history.

(56) References Cited

U.S. PATENT DOCUMENTS 6,288,585 B1 * 9/2001 Bando .................. H03L 7/0805 327/156
6,335,655 B1 1/2002 Yamamoto
6,882,580 B2 * 4/2005 Lim ...................... G11C 7/222 365/194
2003/0210575 A1 * 11/2003 Seo ...................... G11C 7/1045 365/191
2005/0207227 A1 9/2005 Stubbs et al.
2007/0140028 A1 6/2007 Pan et al.
2022/0093140 A1 3/2022 Zhang
2023/0326514 A1 * 10/2023 Ayyapureddi ....... G11C 7/1093

FOREIGN PATENT DOCUMENTS

KR 10-1998-0064159 10/1998
KR 10-2008-0091376 10/2008
KR 10-2138770 7/2020
KR 10-2022-0106789 7/2022

* cited by examiner

*Primary Examiner* — Han Yang
(74) *Attorney, Agent, or Firm* — MORGAN, LEWIS & BOCKIUS LLP

(57) ABSTRACT

A memory device includes a reference voltage generator configured to generate a reference voltage, and a data input/output (I/O) buffer configured to receive a data signal having a first phase, generate a phase control signal having a second phase opposite to the first phase, and generate an output signal based on the data signal, the phase control signal, and the reference voltage.

20 Claims, 10 Drawing Sheets

10
100
MEMORY CONTROLLER
CMD CHANNEL
ADDR CHANNEL
DATA CHANNEL
200
MEMORY DEVICE
210
DATA IO BUFFER
211
PHASE CONTROL BUFFER
SIG_PC
213
INPUT BUFFER
OUT
230
REFERENCE VOLTAGE GENERATOR
D_IN
VREF

FIG. 5

MEMORY DEVICE AND MEMORY SYSTEM

CROSS-REFERENCE TO RELATED APPLICATION

This patent application claims priority under 35 U.S.C § 119 to Korean Patent Application No. 10-2023-0146780 filed in the Korean Intellectual Property Office on Oct. 30, 2023, the disclosure of which is incorporated by reference.

(a) TECHNICAL FIELD

The present disclosure is directed to a memory device and a memory system.

(b) DISCUSSION OF RELATED ART

A dynamic random access memory (DRAM) is a type of random-access semiconductor memory that stores each bit of data in a memory cell, usually consisting of a tiny capacitor and a transistor. Since electric charge on the capacitor gradually leaks away, a memory refresh circuit is used to perodically the data. A data transmission method for the DRAM includes a multi drop channel that connects multiple chips to one signal line at the same time to increase transmission data capacity, and a single ended method that connects one chip to one signal line.

Most memories adopt the single ended method to reduce the number of signal lines and pins. In the single ended method, data may be detected using a voltage difference between a reference voltage and data. However, parasitic resistances, parasitic inductances, and parasitic capacitances may be present at input pins of DRAM chips. The reference voltage may fluctuate due to these parasitic components, thereby reducing accuracy of the memory device.

SUMMARY

The present disclosure attempts to provide a memory device capable of providing a stable reference voltage.

According to an embodiment of the present disclosure, a memory device includes: a reference voltage generator abd a data input/output (I/O) buffer. The reference voltage generator is configured to generate a reference voltage. The data input/output (I/O) buffer is configured to receive a data signal having a first phase, generate a phase control signal having a second phase opposite to the first phase, and generate an output signal based on the data signal, the phase control signal, and the reference voltage.

According to an embodiment of the present disclosure, a memory system includes: a memory controller and a memory device. The memory controller is configured to transmit a data signal having a first phase. The memory device is configured to receive the data signal, and generate an output signal corresponding to the data signal based on a reference voltage for detecting the data signal, a phase control signal having a second phase opposite to the first phase, and the data signal.

According to an embodiment of the present disclosure, a memory device includes: a reference voltage generator and a data input/output (I/O) buffer. The reference voltage generator is configured to generate a reference voltage. The data input/output (I/O) buffer is configured to receive the reference voltage through a first node, receive a data signal having a first phase through a third node, generate a phase control signal having a second phase opposite to the first phase, generate an output signal by amplifying a difference between the reference voltage and the data signal, and output the output signal through a second node.

BRIEF DESCRIPTION OF THE DRAWINGS

FIG. 5 is a circuit diagram illustrating a data input/output (IO) buffer according to an embodiment.

DETAILED DESCRIPTION

Figure 1:
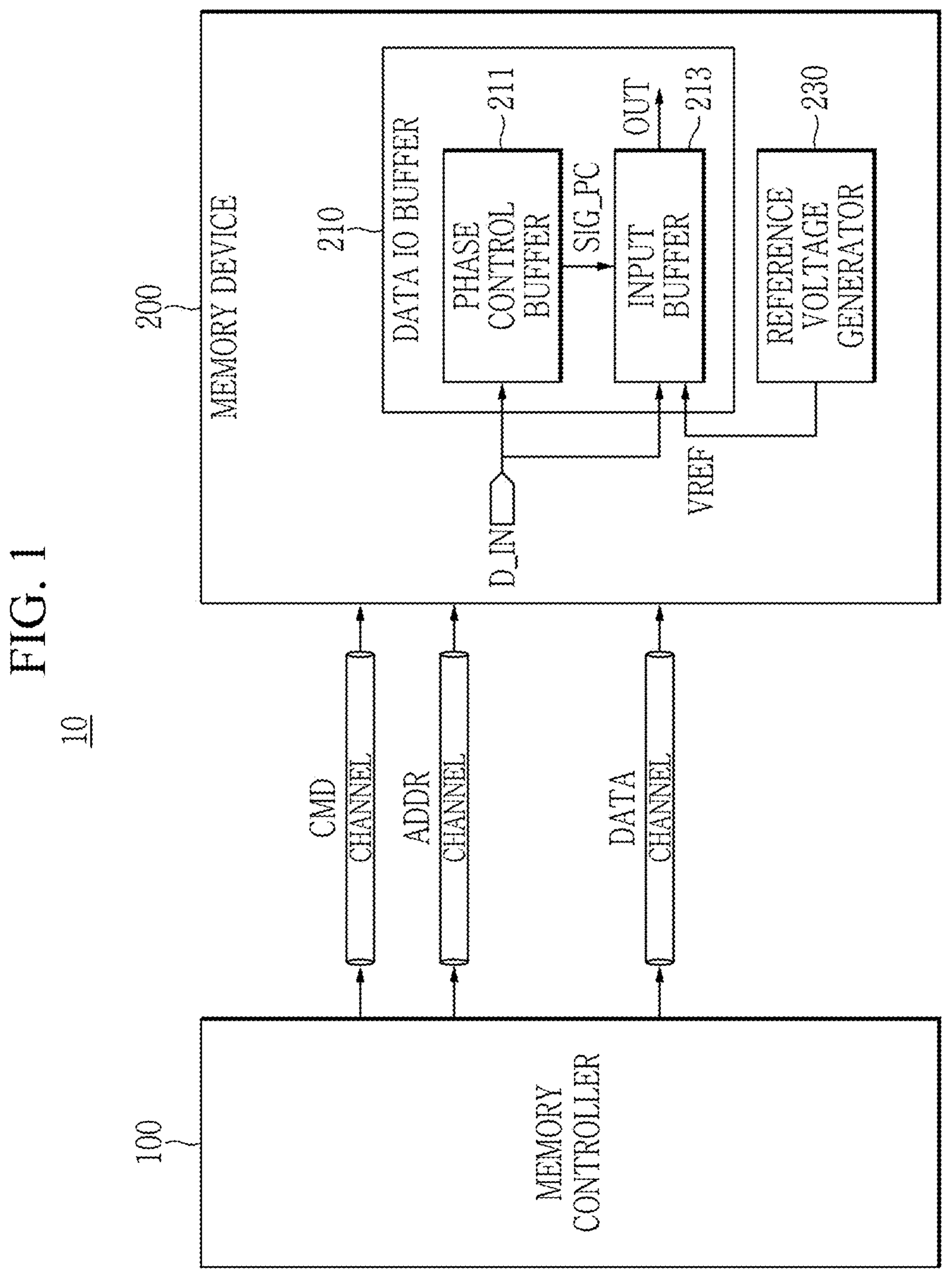
FIG. 1 is a block diagram illustrating a memory system according to an embodiment.

In the following detailed description, only certain embodiments of the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification. In flowcharts described with reference to the drawings, an order of operations may be changed, several operations may be merged, some operations may be divided, and specific operations may not be performed.

In addition, an expression written in singular may be construed in singular or plural unless an explicit expression such as "one" or "single" is used.

FIG. 1 is a block diagram illustrating a memory system according to an embodiment.

Referring to FIG. 1, a memory system 10 includes a memory controller 100 (e.g., a controller circuit) and a memory device 200.

In some embodiments, the memory device 200 and the memory controller 100 are connected through a channel and may exchange signals through the channel. Meanwhile, a type of signals transmitted between the memory device 200 and the memory controller 100 may be preset, and the memory device 200 and the memory controller 100 may exchange signals according to a predetermined type.

The memory controller 100 may access the memory device 200 according to a request from an external host. The memory controller 100 may control a memory operation of the memory device 200 by providing the signals to the memory device 200. The signal may include a command CMD and an address ADDR. The command may include a read/write command. The read/write command may be a command for performing a read operation of reading data stored in the memory device 200 or a write operation of writing data to the memory device 200.

The memory controller 100 may transmit signals according to data DATA to the memory device 200 through a channel. In an embodiment, the memory controller 100 transmits signals using a single-ended signaling method. The memory device 200 may receive signals transmitted through a channel from the memory controller 100 and determine bits of a transmission signal by comparing the transmission signal and a reference signal. The number of channels required to implement the single-ended signaling may be less than the number of channels required to implement a double-ended signaling (or differential signaling) method. The double-ended signaling method may be a method of receiving the signals transmitted through the channel from the memory controller 100 and comparing the transmission signals to determine the bits of the transmission signals. Hereinafter, it is assumed that the memory controller 100 transmits signals to the memory device 200 through the single-ended signaling method.

The memory device 200 includes a data input/output (IO) buffer 210 and a reference voltage generator 230.

The data IO buffer 210 may receive the data DATA to be written to the memory device 200 from the memory controller 100 as a data input signal D_IN. The data IO buffer 210 may read the data DATA and provide the read data to the memory controller 100. In an embodiment, the data IO buffer 210 includes a phase control buffer 211 and an input buffer 213.

The phase control buffer 211 may generate a phase control signal SIG_PC based on a data input signal D_IN received from the memory controller 100. The phase control buffer 211 may transmit the generated phase control signal SIG_PC to the input buffer 213.

The input buffer 213 may receive the data input signal D_IN from the memory controller 100. The input buffer 213 may receive a reference voltage VREF from the reference voltage generator 230.

The input buffer 213 may process the data input signal D_IN based on the reference voltage VREF. In an embodiment, the input buffer 213 converts the data input signal D_IN by comparing the reference voltage VREF and the data input signal D_IN.

In an embodiment, the input buffer 213 further receives a phase control signal SIG_PC from the phase control buffer 211. The input buffer 213 may compensate for the reference voltage VREF based on the phase control signal SIG_PC and process the data input signal D_IN based on the compensated reference voltage. For example, the input buffer 213 may convert the data input signal D_IN by comparing the compensated reference voltage and the data input signal D_IN.

Thereafter, the input buffer 213 may output the processed data input signal D_IN as an output signal OUT.

The reference voltage generator 230 may generate various voltages used to drive the memory device 200. The reference voltage generator 230 may receive a power supply voltage from outside and generate the reference voltage VREF based on the power supply voltage. In an embodiment, the reference voltage generator 230 includes a band gap reference (BGR) circuit.

The reference voltage VREF may be a voltage used by the data IO buffer 210 to determine a data value of the data input signal D_IN from the memory controller 100. In an embodiment, the reference voltage VREF is an average value of the voltages of the data input signals D_IN.

Figure 2:
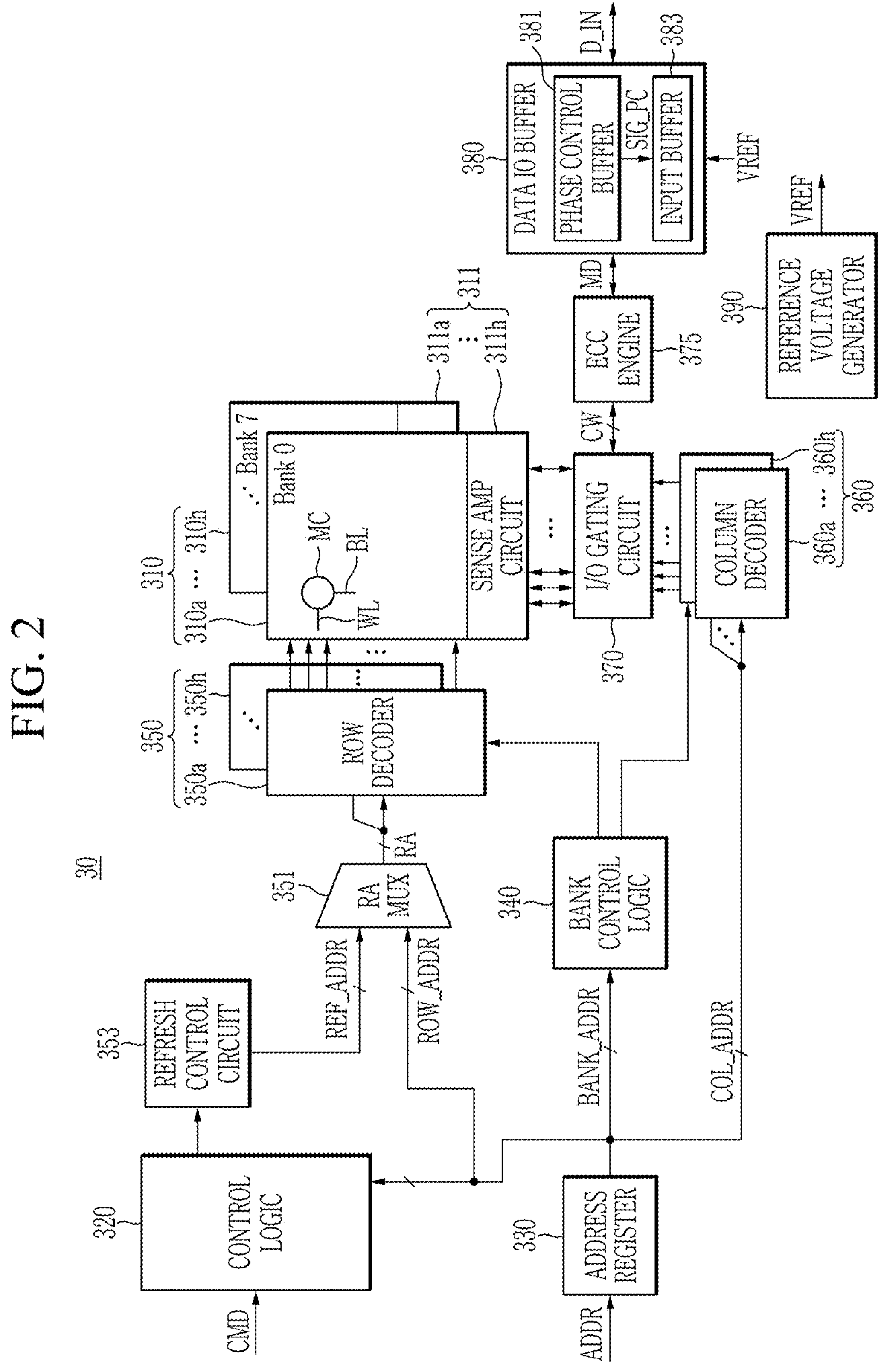
FIG. 2 is a block diagram illustrating a memory device according to an embodiment.

FIG. 2 is a block diagram illustrating a memory device according to an embodiment.

Referring to FIG. 2, the memory device 30 includes a memory cell array 310, a sense amplifier circuit 311, control logic 320 (e.g., a logic circuit), an address register 330, a bank control logic 340 (e.g., a logic circuit), and a row decoder 350 (e.g., a decoder circuit), a column decoder 360 (e.g., an decoder circuit), an I/O gating circuit 370, an ECC engine 375 (e.g., a logic circuit), a data IO buffer 380, and a reference voltage generator 390. The memory device 30 may be used to implement the memory device 200.

While FIG. 2 illustrates that the sense amplifier circuit 311, the row decoder 350, and the column decoder 360 include a plurality of sense amplifier circuits, a plurality of row decoders, and a plurality of column decoders connected to each memory bank, the present disclosure is not limited thereto.

The memory cell array 310 may include a plurality of memory banks **310*a*-310*h*. The plurality of memory banks 310*a* to 310*h* may store the data DATA received from the memory controller (100 in FIG. 1). For example, each of the plurality of memory banks 310*a* to 310*h* may be dynamic random access memory (DRAM) including a plurality of volatile memory cells, and dynamic random access memory (DRAM) such as thyristor random access memory (TRAM), static random access memory (SRAM), and double data rate synchronous dynamic random access memory (DDR SDRAM). In some embodiments, each of the plurality of memory banks 310*a* to 310*h*** may be phase change random access memory (PRAM), resistive random access memory (RRAM), magnetic random access memory (MRAM), and ferroelectric random access memory FRAM having resistive memory cells.

Each memory bank **310*a* to 310*h*** may include a plurality of rows, a plurality of columns, and a plurality of memory cells MC arranged at the intersection of the plurality of rows and columns. Each memory cell among the memory cells MC may include one transistor and one capacitor.

In some embodiments, the plurality of rows may be defined by a plurality of word lines WL, and the plurality of columns may be defined by a plurality of bit lines BL. The memory device 30 may perform the read operation or write operation of the data input signal D_IN with respect to the plurality of memory cells MC.

Although eight memory banks BANK0 to BANK7 **310*a* to 310*h* are illustrated in FIG. 2**, the number of memory banks is not limited thereto.

The sense amplifier circuit 311 may include a plurality of bit line sense amplifiers connected to a plurality of bit lines BL of the memory cell array 310. The plurality of bit line sense amplifiers may detect data input and output through a bit line BL and input and output the detected data.

The control logic 320 may control an operation of the memory device 300. For example, the control logic 320 may generate a control signal so that the memory device 300 performs the read operation or write operation. The control logic 320 may include at least one of a command decoder for decoding a command CMD received from a memory controller (e.g., 100 in FIG. 1) and a mode register for setting an operation mode of the memory device 30.

The address register 330 may receive the address ADDR provided from the memory controller (100 in FIG. 1). The address ADDR may include a bank address BANK_ADDR, a row address ROW_ADDR indicating a row of the memory cell array 310, and a column address COL_ADDR indicating a column of the memory cell array 310. The address register 330 may provide the received bank address BANK_ADDR to the bank control logic 340, the received row address ROW_ADDR to a row address multiplexer 351, and the received column address COL_ADDR to the column decoder 360.

The bank control logic 340 may generate a bank control signal in response to the bank address BANK_ADDR. The row decoder 350 and the column decoder 360 may activate corresponding banks in response to the bank control signal. In response to the bank control signal, the row decoder 350 corresponding to the bank address BANK_ADDR among a plurality of row decoders 350*a* to 350*h* may be activated, and the column decoder 360 corresponding to the bank address BANK_ADDR among the plurality of column decoders 360*a* to 360*h* may be activated.

The row address multiplexer 351 may receive the row address ROW_ADDR from the address register 330 and receive the row address REF_ADDR to be refreshed from a refresh control circuit 353. The row address multiplexer 351 may selectively output the row address ROW_ADDR received from the address register 330 and the row address REF_ADDR received from the refresh control circuit 353 to the row decoder 350.

The row decoder 350 may select a row to be activated from a plurality of rows of the memory cell array 310 based on the row address ROW_ADDR or REF_ADDR received from the row address multiplexer 351. The row decoder 350 may apply a driving voltage to the word line corresponding to the row to be activated. In some embodiments, the plurality of row decoders 350*a* to 350*h* respectively corresponding to a plurality of memory banks 310*a* to 310*h* may be provided.

The column decoder 360 may select a column to be activated from among a plurality of columns of the memory cell array 310 based on the column address. The column decoder 360 may activate the sense amplifier circuit 311 corresponding to the column address COL_ADDR through the I/O gating circuit 370 to select the column to be activated. In some embodiments, the plurality of memory banks 310*a* to 310*h* respectively corresponding to the plurality of column decoders 360*a* to 360*h* may be provided.

The I/O gating circuit 370 gates I/O data and may include a data latch for storing data read from the memory cell array 310. The data read from the memory cell array 310 may be detected by the sense amplifier circuit 311 and stored in the I/O gating circuit 370 (e.g., data latch). The data detected by the sense amplifier circuit 311 may be stored in the I/O gating circuit 370 as a codeword CW.

In addition, the I/O gating circuit 370 may include a write driver for writing data to the memory cell array 310. The I/O gating circuit 370 may write a codeword CW to the memory cell array 310 through a write driver. The I/O gating circuit 370 may transmit the codeword CW to the ECC engine 375 or receive a codeword CW from the ECC engine 375.

The ECC engine 375 may perform ECC decoding on the codeword CW stored in the I/O gating circuit 370. When an error is detected in the codeword CW, the ECC engine 375 may generate an error signal while correcting an error, and provide the corrected codeword CW as main data MD to the memory controller (100 in FIG. 1) through the data IO buffer 380.

In addition, the ECC engine 375 may perform the ECC decoding on the main data MD received through the data IO buffer 380. In an embodiment, the ECC engine 375 generates parity bits based on main data MD and provides the main data MD and parity bits as the codewords CW to the I/O gating circuit 370. The data IO buffer 380 may provide the data read from the memory cell array 310 to the memory controller (100 in FIG. 1).

The data IO buffer 380 may receive a data input signal D_IN to be written to the memory cell array 310 from the memory controller (100 in FIG. 1). The data IO buffer 380 may generate the main data MD based on the received data input signal D_IN and provide the generated main data MD to the ECC engine 375.

In an embodiment, the data IO buffer 380 includes a phase control buffer 381 and an input buffer 383. The phase control buffer 381 may generate a phase control signal SIG_PC based on the data input signal D_IN. The phase control buffer 381 may transmit the phase control signal SIG_PC to the input buffer 383. The input buffer 383 may process the data input signal D_IN based on the phase control signal SIG_PC and the reference voltage VREF and generate an output signal based on the processed input signal D_IN. The input buffer 383 may provide the output signal as the main data MD to the ECC engine 375.

The reference voltage generator 390 may generate various voltages to drive the memory device 30. The reference voltage generator 390 may receive a power supply voltage from outside and generate a reference voltage VREF based on the power supply voltage. The reference voltage VREF may be a voltage used by the data IO buffer 380 to detect the input data. The reference voltage generator 390 may transmit the reference voltage VREF to the data IO buffer 380. In an embodiment, the data IO buffer 380 detects data by amplifying a difference between the data input signal D_IN and the reference voltage VREF.

Figure 3:
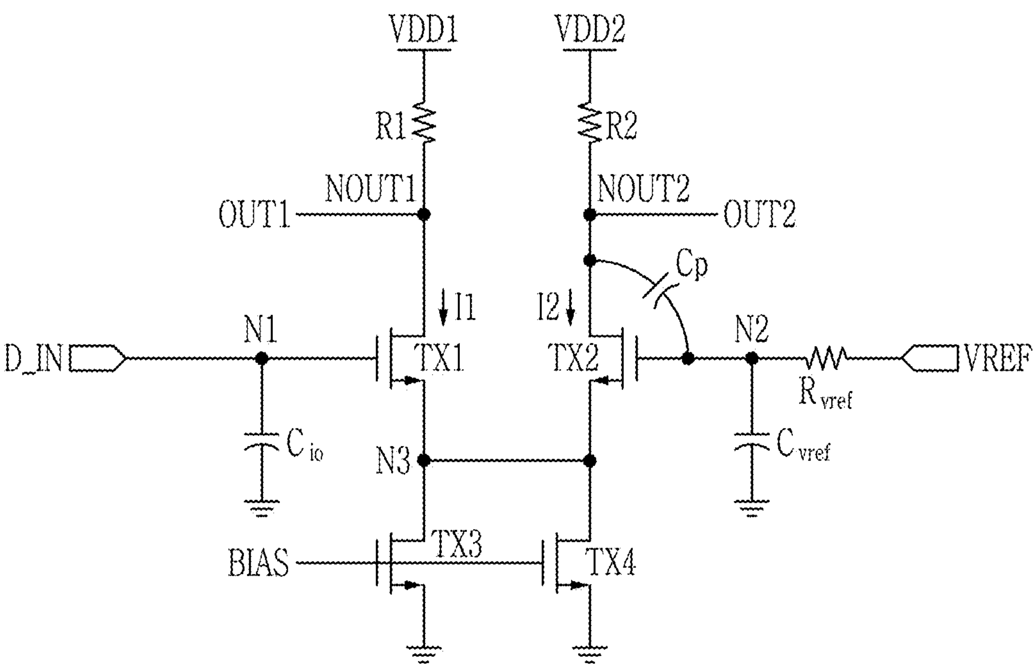
FIG. 3 is a circuit diagram illustrating an input buffer of the memory device according to an embodiment.

FIG. 3 is a circuit diagram illustrating a non-optimized data IO buffer.

Specifically, FIG. 3 is a circuit diagram illustrating a data IO buffer 400 when the data IO buffer 400 does not include the phase control buffer (381 in FIG. 3).

The data IO buffer 400 may convert the data input signal D_IN by comparing the received data input signal D_IN with the reference voltage VREF.

Referring to FIG. 3, the data IO buffer 400 includes a first transistor TX1, a second transistor TX2, a third transistor TX3, and a fourth transistor TX4.

The data input signal D_IN may be input to the data input node N1. The reference voltage VREF is input to a reference voltage input node N2.

A gate of the first transistor TX1 is connected to a first node N1, a source of the first transistor TX1 is connected to a third node N3, and a drain of the first transistor TX1 is connected to a first output node NOUT1. In this case, the data input signal D_IN is input to the gate of the first transistor TX1 through the first node N1.

An input capacitor CI/O is connected between the first node N1 and ground.

The first resistor R1 is connected between the first output node NOUT1 and a first power source voltage VDD1.

A gate of the second transistor TX2 is connected to the second node N2, a source of the second transistor TX2 is connected to the third node N3, and a drain of the second transistor TX2 is connected to a second output node NOUT2. In this case, the reference voltage VREF is provided to the second node N2 through a reference resistor $R_{vref}$. The reference voltage VREF provided to the second node N2 is connected to the gate of the second transistor TX2.

A reference capacitor $C_{vref}$ is connected between the second node N2 and the ground. Accordingly, a signal of a direct current (DC) component of the reference voltage VREF may not pass. In some embodiments, the reference voltage VREF may be an average value of voltage values of the data input signal D_IN. For example, the reference voltage VREF may be a DC voltage having a constant level. Accordingly, a constant level of voltage maybe provided to the second node N2. A reference resistor $R_{vref}$ may be set to have a small resistance value and the reference capacitor $C_{vref}$ may be set to have a large capacitance to provide a constant level of voltage to the second node N2. When the reference resistance $R_{vref}$ has a small resistance value, the fluctuation in voltage applied to the second node N2 due to the fluctuation in the reference voltage VREF may be small. In addition, when the reference capacitor $C_{vref}$ has a large capacitance, the DC component of the reference voltage VREF may be easily stored.

However, a parasitic capacitor Cp may be present between the second output node NOUT2 and the second node N2. Accordingly, the change in the second output signal OUT2 may affect the voltage applied to the second node N2. For example, when the second output signal OUT2 transitions from a logic low L to a logic high H, the voltage applied to the second node N2 may also increase, and when transitioning from logic high H to logic low L, the voltage applied to the second node N2 may decrease. Therefore, even if the reference voltage VREF of the DC level is input, the voltage of the second node N2 may fluctuate due to the influence of the parasitic capacitor Cp.

The second resistor R2 is connected between the second output node NOUT2 and a second power source voltage VDD2.

The relationship between the second output signal OUT2 and the second node N2 in the frequency domain is as follows.

$$V(N2) = \frac{s * Cp * OUT2}{s * Cp + (1 + s * R2 * Cp)\left(\frac{1}{Rvref} + s * Cvref\right)} \quad \text{(Equation 1)}$$

As illustrated in Equation 1, the voltage of the second node N2 may affect the second output signal OUT2.

The drains of the third transistor TX3 and the fourth transistor TX4, the sources of the first transistor TX1 to which the data input signal D_IN is input, and the source of the second transistor TX2 to which the reference voltage VREF is input may be connected to become the third node N3. The sources of the third transistor TX3 and the fourth transistor TX4 are connected to nodes receiving a ground GND voltage. That is, the third transistor TX3 and the fourth transistor TX4 may be connected in parallel. The gates of the third transistor TX3 and the fourth transistor TX4 receive a bias voltage BIAS.

The bias voltage BIAS may be controlled by the reference voltage VREF and the power supply voltage VDD. Accordingly, a sum of currents flowing from the drain to the source of the third transistor TX3 and the fourth transistor TX4 may be constant. That is, the third transistor TX3 and the fourth transistor TX4 may operate as a constant current source. When the bias voltage BIAS has a constant level, the current magnitude may be maintained constant. In other words, a sum of a first current I1 flowing through the first transistor TX1 and a second current I2 flowing through the second transistor TX2 may also be maintained constant.

The first power supply voltage VDD1 and the second power supply voltage VDD2 are illustrated as different voltages, but the present disclosure is not limited thereto. For example, the first power supply voltage VDD1 and the second power supply voltage VDD2 may be the same voltage.

When the voltage level of the data input signal D_IN is constant at a logic low L or a logic high H, the current flowing through the third transistor TX3 may be constant. Accordingly, the current flowing through the fourth transistor TX4 may also be constant. Accordingly, the second output node NOUT2 may output the second output signal OUT2 at a constant level.

When the voltage level of the data input signal D_IN transitions from logic low L to logic high H, the gate voltage of the first transistor TX1 increases, so the first current I1 flowing through the first transistor TX1 may increase. In this case, since the input capacitor $C_{I/O}$ is connected to the first node N1, a constant level of voltage, that is, the signal with the DC component may not pass. When the first current I1 increases, a voltage drop increases due to a first resistor R1, so the voltage applied to the first output node NOUT1 may decrease.

Meanwhile, when the voltage level of the data input signal D_IN transitions from logic low L to logic high H, the first current I1 increases, so the second current I2 may decrease. When the second current I2 decreases, a voltage drop decreases due to a second resistor R2, so the voltage applied to the second output node NOUT2 may increase.

When the voltage level of the data input signal D_IN transitions from logic high H to logic low L, the gate voltage of the first transistor TX1 deceases, so the first current I1 flowing through the first transistor TX1 may decrease. When the first current I1 decreases, the voltage applied to the first output node NOUT1 may increase.

Meanwhile, when the voltage level of the data input signal D_IN transitions from logic high H to logic low L, the first current I1 decreases, so the second current I2 may increase. When the second current I2 increases, the voltage applied to the second output node NOUT2 may decrease.

A first output signal OUT1 may have an opposite phase to the data input signal D_IN. Specifically, the first output signal OUT1 may change from logic high H to logic low L in response to the change in the first current I1 when the data input signal D_IN changes from logic low L to logic high H, and may change from logic low L to logic high H in response to the change in the first current I1 when the data input signal D_IN changes from logic high H to logic low L.

The second output signal OUT2 may have the same phase as the data input signal D_IN. Specifically, the second output signal OUT2 may change from logic low L to logic high H in response to the change in the second current I2 when the data input signal D_IN changes from logic low L to logic high H, and may change from logic high H to logic low L in response to the change in the second current I2 when the data input signal D_IN changes from logic high H to logic low L.

However, as illustrated in Equation 1 above, the voltage of the second node N2 may be affected by a coupling phenomenon between the second node N2 and the second output node NOUT2. Accordingly, the voltage of the second node N2 may have noise having the same phase as the data input signal D_IN. When noise occurs in the voltage of the second node N2, it may be substantially the same as receiving a reference voltage including noise. As described above, the data IO buffer 400 may compare the reference voltage and the data input signal D_IN to convert the reference voltage into the main data MD. However, when the reference voltage VREF fluctuates, it may be difficult for the data IO buffer 400 to accurately detect data in the data input signal D_IN.

Figure 4:
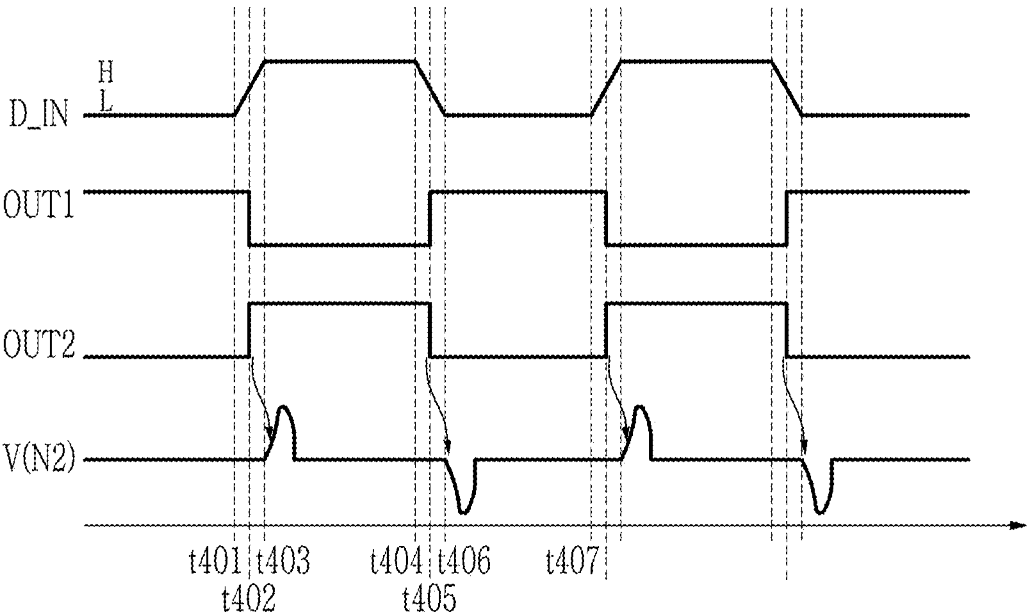
FIG. 4 is a timing diagram illustrating an operation of the input buffer illustrated in FIG. 3.

FIG. 4 is a timing diagram illustrating the operation of the data IO buffer according to FIG. 3. FIG. 4 illustrates a level change of the data input signal D_IN, a level change of the first output node NOUT1, a level change of the second output node NOUT2, and a level change in voltage V(N2) of the second node N2.

During times t401 to t403, the data input signal D_IN changes from logic low L to logic high H. As the voltage level of the data input signal D_IN input to the gate of the first transistor TX1 increases, the first current I1 may increase. As the first current I1 increases, the second current I2 may decrease.

At time t402, as the data input signal D_IN changes from logic low L to logic high H, the first output signal OUT1 may transition from logic high H to logic low L. In addition, the second output signal OUT2 may transition from logic low L to logic high H. While FIG. 4 illustrates that the first output signal OUT1 and the second output signal OUT2 transition at time t402 at the same time, the present disclosure is not limited thereto. For example, the first output signal OUT1 and the second output signal OUT2 may transition after a certain period of time in response to the change in the data input signal D_IN.

For a certain period of time from time t403, the voltage V(N2) may include a noise voltage having a positive value.

Specifically, the noise voltage may be due to the effect of the fluctuation of the second output signal OUT2 on the voltage V(N2) of the second node N2 due to the parasitic capacitor Cp. Due to the noise voltage, the data IO buffer 400 may incorrectly detect the data input signal D_IN. For example, the data IO buffer 400 may detect data in the data input signal D_IN by amplifying the difference between the reference voltage VREF including the noise voltage and the data input signal D_IN. However, the difference value between the reference voltage VREF and the data input signal D_IN may change due to the noise voltage. Accordingly, the data IO buffer 400 may not accurately detect the data in the data input signal D_IN.

During times t403 to t404, the data input signal D_IN is logic high H.

While the data input signal D_IN is logic high H, the first output signal OUT1 may be logic low L and the second output signal OUT2 may be logic high H. Since the data input signal D_IN is maintained at a constant level, the influence of the data input signal D_IN on the second node N2 due to the parasitic capacitor Cp may decrease. Accordingly, the voltage V(N2) may be maintained at a constant level of voltage. For example, the voltage V(N2) may be maintained at the reference voltage VREF.

During time t404 to t406, the data input signal D_IN changes from logic high H to logic low L.

As the voltage level of the data input signal D_IN input to the gate of the first transistor TX1 decreases, the first current I1 may decrease. When the first current I1 decreases, the second current I2 may increase.

At time t404, when the data input signal D_IN changes from logic high L to logic low L, the first output signal OUT1 may transition from logic low L to logic high H. In addition, the second output signal OUT2 may transition from logic high H to logic low L. While FIG. 4 illustrates that the first output signal OUT1 and the second output signal OUT2 transition at time t405 at the same time, the present disclosure is not limited thereto. For example, the first output signal OUT1 and the second output signal OUT2 may transition after a certain period of time in response to the change in the data input signal D_IN.

For a certain period of time from time t406, the voltage V(N2) may include a noise voltage having a negative value.

During times t406 to t407, the data input signal D_IN is logic low L.

While the data input signal D_IN is logic low L, the first output signal OUT1 may be logic high H and the second output signal OUT2 may be logic low L. Since the data input signal D_IN is maintained at a constant level, the influence of the data input signal D_IN on the second node N2 due to the parasitic capacitor Cp may decrease. Accordingly, the voltage V(N2) may be maintained at a constant level of voltage. For example, the voltage V(N2) may be maintained at the reference voltage VREF.

The operation of the data IO buffer 400 after time t407 may be substantially the same as the operation of the input buffer during times t401 to t406.

Figure 5:
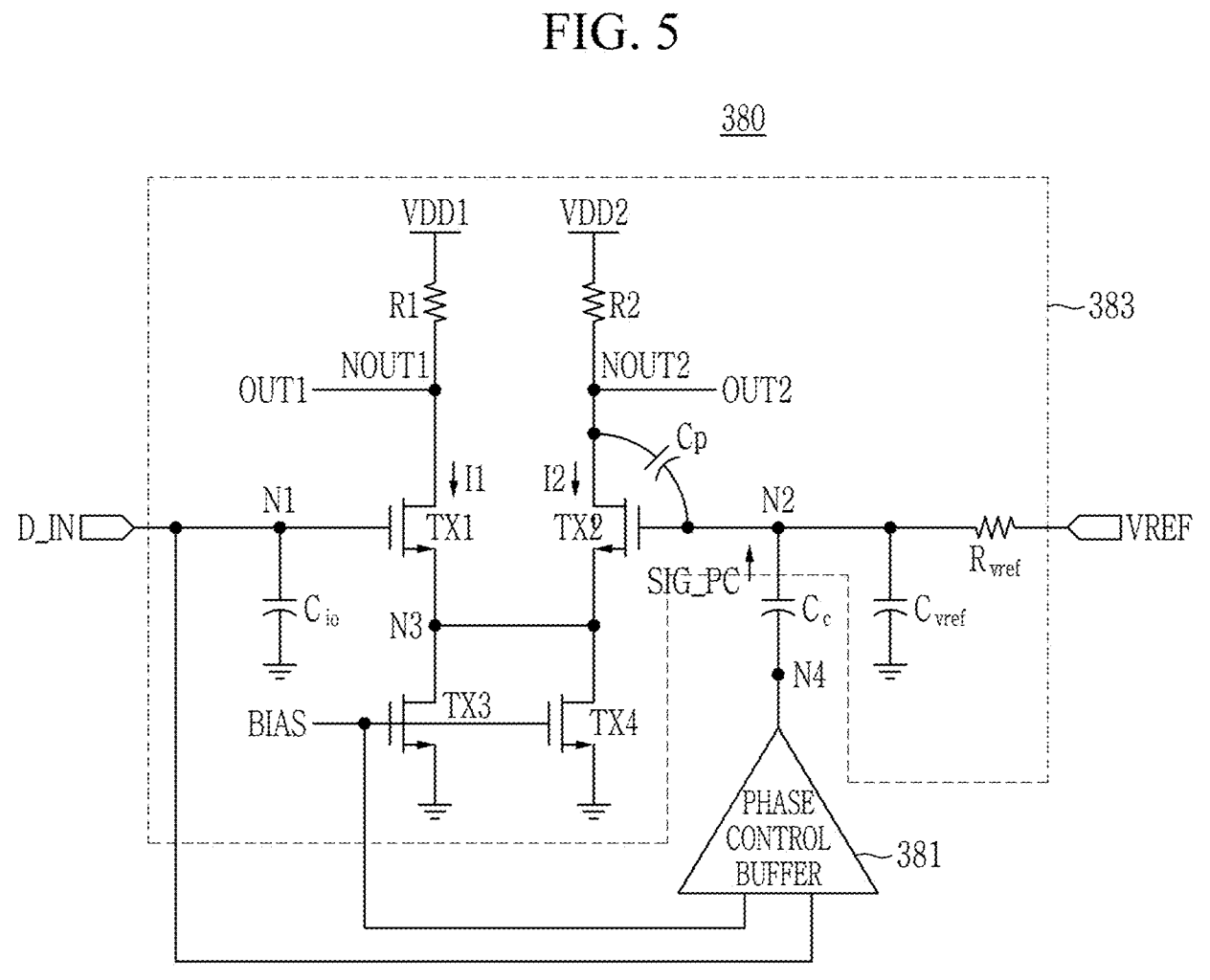

FIG. 5 is a circuit diagram illustrating the data IO buffer according to an embodiment.

As illustrated in FIG. 5, the data IO buffer 380 further includes the phase control buffer 381 connected to the input buffer 383 according to FIG. 3.

The input buffer 383 may be similar to the data IO buffer 400 described with reference to FIG. 3 unless otherwise specified.

A first input terminal of the phase control buffer 381 is connected to the first node N1 to receive the input data signal D_IN. A second input terminal of the phase control buffer 381 receive a bias voltage BIAS. The second input terminal may be connected to gates of transistors TX3 and TX4. An output terminal of the phase control buffer 381 is connected to a fourth node N4.

In an embodiment, a phase capacitor $C_c$ is connected between the fourth node N4 and the second node N2.

The phase control buffer 381 may reduce the influence of the second output node NOUT2 on the second node N2 through the parasitic capacitor Cp. In an embodiment, the phase control buffer 381 receives the input data signal D_IN, generates a signal having an opposite phase to the input data signal D_IN based on the input data signal D_IN, and transmits the phase control signal SIG_PC to the second node N2 through the phase capacitor $C_c$.

For example, the phase control signal SIG_PC may have a size or amplitude sufficient to remove noise caused by the second node N2 by the parasitic capacitor Cp. In an embodiments, the size or amplitude of the phase control signal SIG_PC is preset based on the input data signal D_IN, the type of channel transmitting the input data signal D_IN, the type of the memory controller (100 in FIG. 1), etc.

As another example, the phase control signal SIG_PC may have a size greater than the size that may be sufficient to remove the noise caused by the second node N2. For example, an amplitude of the phase control signal SIG_PC may be greater than an amplitude sufficient to remove the noise caused by the second node N2. The memory controller (100 in FIG. 1) may transmit the data DATA to the memory device (200 in FIG. 1) through the channel. For example, when the memory controller (100 in FIG. 1) transmits the data through a channel such as a coaxial cable, PCB trace, etc., a bandwidth of the channel may be limited due to a channel load, a skin effect, a dielectric loss, etc., so high frequency components of the data DATA may be weakened. The phase control signal SIG_PC of the size greater than a size sufficient to remove the noise caused by the second node N2 may compensate for the high frequency components of the data DATA weakened while being transmitted by the channel.

Figure 6:
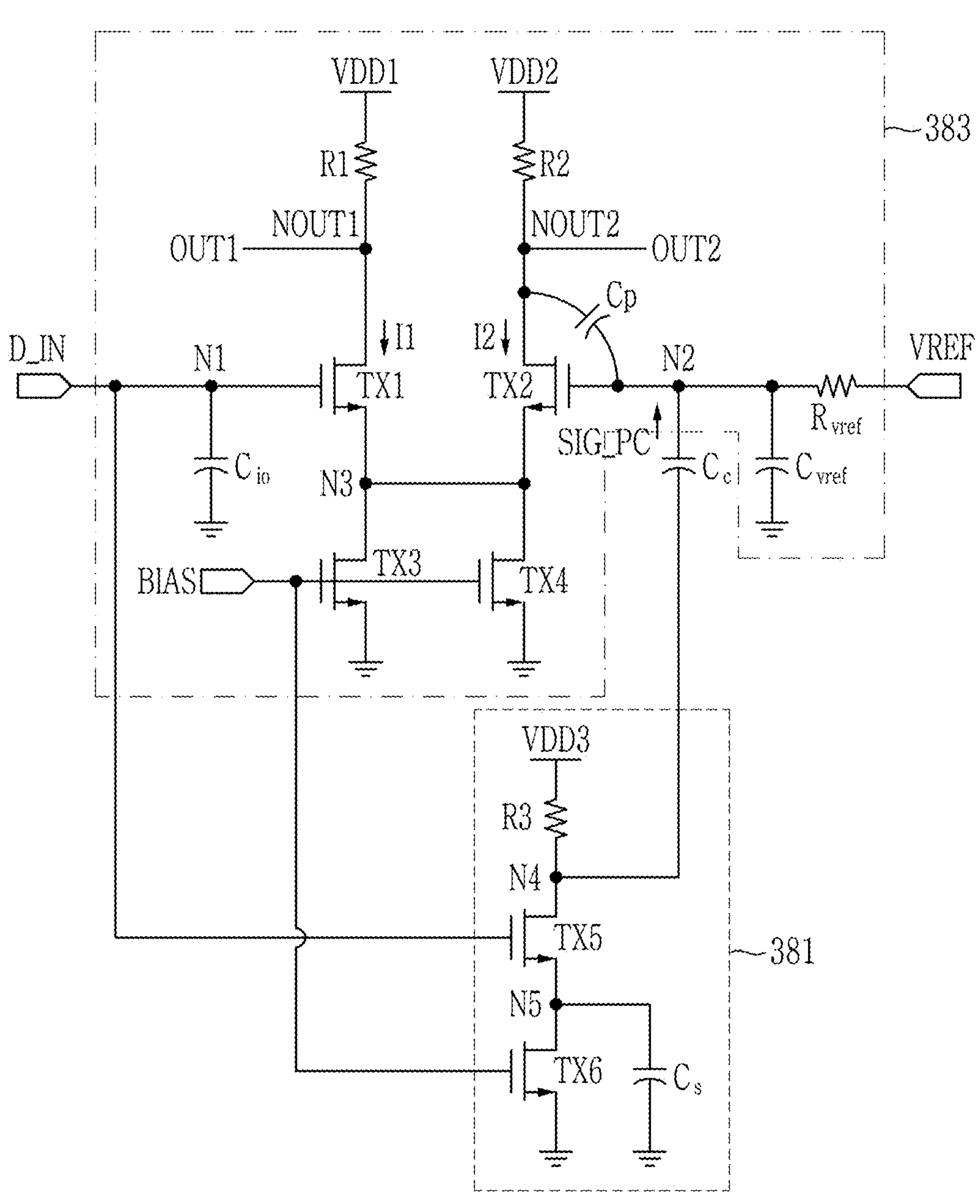
FIG. 6 is a circuit diagram illustrating the data IO buffer according to the embodiment.

FIG. 6 is a circuit diagram illustrating the data IO buffer according to an embodiment.

FIG. 6 is a circuit diagram exemplarily illustrating the phase control buffer 381 according to an embodiment.

As illustrated in FIG. 6, the phase control buffer 381 includes a fifth transistor TX5 and a sixth transistor TX6.

A gate of the fifth transistor TX5 is connected to the first node N1, a drain of the fifth transistor TX5 is connected to the fourth node N4, and a source of the fifth transistor TX5 is connected to a fifth node N5.

The bias voltage BIAS is input to a gate of the sixth transistor TX6, a drain of the sixth transistor TX6 is connected to the fifth node N5, and a source of the sixth transistor TX6 is connected to a ground power supply GND.

A third resistor R3 is connected between the fourth node N4 and a node receiving a third power source voltage VDD3. A storage capacitor Cs may be connected between the fifth node N5 and the ground power supply GND. The phase capacitor $C_c$ is connected between the fourth node N4 and the second node N2. The phase control buffer 381 observed from the fourth node N4 may be expressed as Equation 2 in the frequency domain.

$$\text{V}(N4) = \text{D\_IN} * \frac{g_m R_3}{1 + g_m\left(r_o \backslash\backslash \left(\frac{1}{sCs}\right)\right)} * \frac{\left(\frac{1}{sC_{vref}}\right)\backslash\backslash R_{vref}}{R_3 + \frac{1}{sC_C} + \left(\frac{1}{sC_{vref}}\right)\backslash\backslash R_{vref}} = \text{D\_IN} * \frac{g_m R_3 R_{vref} C_c s(1 + sC_S r_o)}{(sC_S r_o + g_m r_o + 1)\left(s^2(R_s R_{vref} C_c C_{vref}) + s(C_c R_{vref} + C_c R_s C_{vref} R_{vref}) + 1\right)} \quad \text{(Equation 2)}$$

In addition, when the phase control buffer 381 is included, the relationship between the second output signal OUT2 and the second node N2 may be expressed as Equation 3 in the frequency domain.

$$\text{V}(N2) = \frac{\left(\frac{s*Cp*OUT2}{1+s*R2*Cp} - \frac{s*Cc*gm*R3*D_{IN}}{1+s*R3*Cc}\right)}{\left(\frac{1}{Rvref} + s*Cvref + \frac{s*Cp}{1+*R2*Cp} + \frac{s*Cc}{1+s*R3*Cc}\right)} \quad \text{(Equation 3)}$$

In this case, assuming that the size of the second output signal OUT2 and the size of the phase control signal SIG_PC are the same, that is, assuming that the second output signal OUT2 is gm*RL*D_IN, Equation 3 may be expressed as Equation 4.

$$\text{V}(N2) = \frac{\left(\frac{s*Cp}{1+s*R2*Cp} - \frac{s*Cc}{1+s*R3*Cc}\right)*OUT2}{\left(\frac{1}{Rvref} + s*Cvref + \frac{s*Cp}{1+*R2*Cp} + \frac{s*Cc}{1+s*R3*Cc}\right)} \quad \text{(Equation 4)}$$

As illustrated in Equation 4, by setting the values of the third resistor R3 and the phase capacitor $C_c$ based on the preset values of the second resistor R2 and the parasitic capacitor Cp, it is possible to adjust the coupling effect of the second output signal OUT2 on the reference voltage VREF by the parasitic capacitor Cp. For example, a value obtained by multiplying the resistance value of the second resistor R2 and the capacitance value of the parasitic capacitor Cp is the same as a value obtained by multiplying the resistance value of the third resistor R3 and the capacitance value of the phase capacitor $C_c$. When the capacitance value of the parasitic capacitor Cp and the capacitance value of the phase capacitor $C_c$ are the same, the V(N2) may have a value of 0. Alternatively, when values of the third resistor R3 and the phase capacitor $C_c$ are set to increase the coupling effect of the second output signal OUT2 on the reference voltage VREF, the V(N2) may have a negative value.

In FIG. 6, an embodiment of the possible phase control buffer 381 is illustrated and described, but the present disclosure is not limited thereto. For example, the phase control buffer 381 may be various buffers having a form in which the phase of the input data signal D_IN is inverted, and thus, the input data signal D_IN may be transmitted to the node to which the reference voltage is input.

Figure 7:
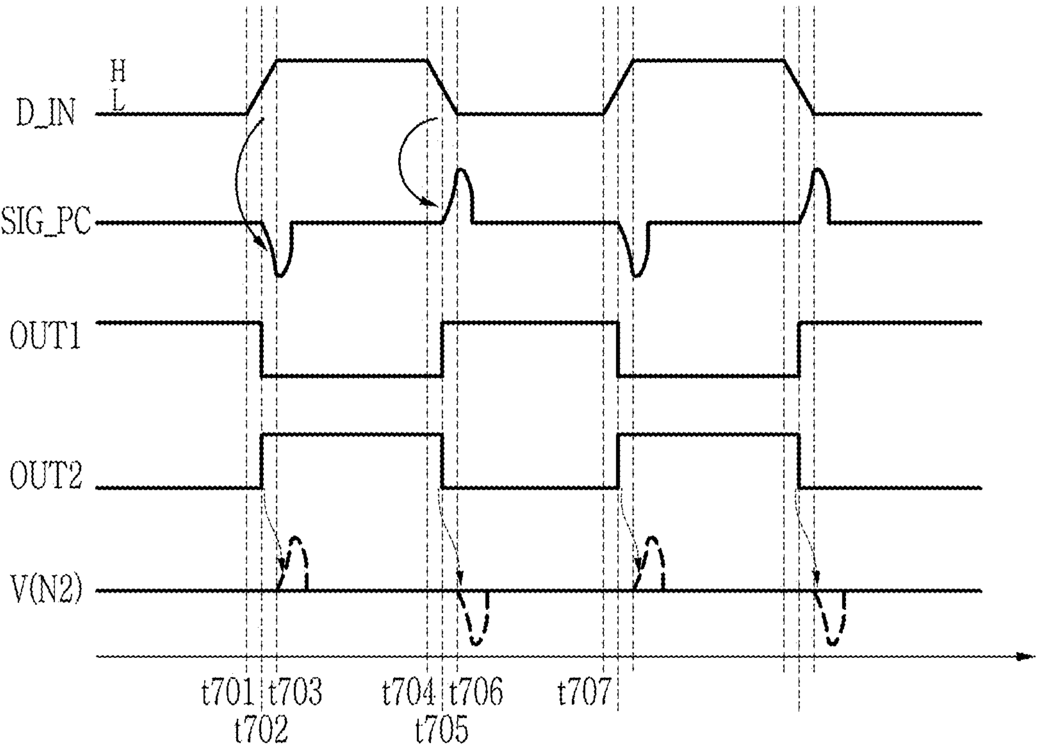
FIG. 7 is a timing diagram illustrating an operation of the input buffer illustrated in FIGS. 5 and 6.

FIG. 7 is a timing diagram illustrating the operation of the input buffer illustrated in FIGS. 5 and 6.

FIG. 7 illustrates the level change of the data input signal D_IN, the level change of the phase control signal SIG_PC, the level change of the first output node NOUT1, the level change of the second output node NOUT2, and the level change of the voltage V(N2) of the second node N2.

During times t701 to t703, the data input signal D_IN changes from logic low L to logic high H.

As the voltage level of the data input signal D_IN input to the gate of the first transistor TX1 increases, the first current I1 may increase. As the first current I1 increases, the second current I2 may decrease.

At time t702, as the data input signal D_IN changes from logic low L to logic high H, the first output signal OUT1 may transition from logic high H to logic low L. In addition, the second output signal OUT2 may transition from logic low L to logic high H. While FIG. 7 illustrates that the first output signal OUT1 and the second output signal OUT2 transition at time t702 at the same time, the present disclosure is not limited thereto and the first output signal OUT1 and the second output signal OUT2 may transition after a certain period of time in response to the change in the data input signal D_IN.

Meanwhile, as the data input signal D_IN changes from logic low L to logic high H, the phase control signal SIG_PC may change to an AC voltage having a negative value, which is the opposite phase of the data input signal D_IN. Whie FIG. 7 illustrates that the phase control signal SIG_PC changes at time t702, the present disclosure is not limited thereto. For example, the phase control buffer 381 receives the data input signal D_IN, so the time for which the phase control signal SIG_PC changes may change depending on the time it takes to output the phase control signal SIG_PC.

For a certain period of time from time t703, the voltage V(N2) may be maintained at a constant level.

Positive noise caused by the parasitic capacitor Cp of the second node N2 may be canceled out by the negative voltage of the phase control signal SIG_PC.

In an embodiment, an absolute value of the voltage value of the phase control signal SIG_PC is greater than an absolute value of the magnitude of the noise. While FIG. 7 illustrates that the voltage value of the phase control signal SIG_PC is similar to the voltage value of the noise, and thus, the voltage V(N2) has a DC level, the present disclosure is not limited thereto. When the voltage value of the phase control signal SIG_PC is greater than the voltage value of the noise, the voltage V(N2) may have an AC voltage having a negative value. The time during which the phase control signal SIG_PC is generated based on the data input signal D_IN and the time during which the noise in the voltage V(N2) is generated by the second output signal OUT2 may be the same or may be similar.

During times t703 to t704, the data input signal D_IN may be logic high H.

While the data input signal D_IN is logic high H, the first output signal OUT1 may be logic low L and the second output signal OUT2 may be logic high H. Since the data input signal D_IN is maintained at a constant level, the influence of the data input signal D_IN on the second node N2 due to the parasitic capacitor Cp may decrease. Accordingly, the voltage V(N2) may be maintained at a constant level of voltage. For example, the voltage V(N2) may be maintained at the reference voltage VREF. In addition, since the data input signal D_IN is maintained at a constant level, the phase control signal SIG_PC may also be maintained at a constant level.

During times t704 to t706, the data input signal D_IN may change from logic high H to logic low L.

As the voltage level of the data input signal D_IN input to the gate of the first transistor TX1 decreases, the first current I1 may decrease. As the first current I1 decreases, the second current I2 may increase.

At time t704, as the data input signal D_IN changes from logic high L to logic low L, the first output signal OUT1 may transition from logic low L to logic high H. In addition, the second output signal OUT2 may transition from logic high H to logic low L. While FIG. 7 illustrates that the first output signal OUT1 and the second output signal OUT2 transition at time t705 at the same time, the present disclosure is not limited thereto. For example, the first output signal OUT1 and the second output signal OUT2 may transition after a certain period of time in response to the change in the data input signal D_IN.

Meanwhile, as the data input signal D_IN changes from logic high H to logic low L, the phase control signal SIG_PC may change to an AC voltage having a positive value, which is the opposite phase of the data input signal D_IN. While FIG. 7 illustrates that the phase control signal SIG_PC changes at time t705, the present disclosure is not limited thereto. Since the phase control buffer 381 receives the data input signal D_IN, the time during which the phase control signal SIG_PC changes may change depending on the time it takes to output the phase control signal SIG_PC.

For a certain period of time from time t706, the voltage V(N2) may be maintained at a constant level.

Negative noise caused by the parasitic capacitor Cp of the second node N2 may be canceled out by the positive voltage of the phase control signal SIG_PC.

In some embodiments, the absolute value of the voltage value of the phase control signal SIG_PC may be greater than the absolute value of the magnitude of the noise. Meanwhile, FIG. 7 illustrates that the voltage value of the phase control signal SIG_PC is similar to the voltage value of the noise, and thus, the voltage V(N2) has a DC level, but the present disclosure is not limited thereto. When the voltage value of the phase control signal SIG_PC is greater than the voltage value of the noise, the voltage V(N2) may have an AC voltage having a positive value.

During times t706 to t707, the data input signal D_IN may be logic low L.

While the data input signal D_IN is logic low L, the first output signal OUT1 may be logic high H and the second output signal OUT2 may be logic low L. Since the data input signal D_IN is maintained at a constant level, the influence of the data input signal D_IN on the second node N2 due to the parasitic capacitor Cp may decrease. Accordingly, the voltage V(N2) may be maintained at a constant level of voltage. For example, the voltage V(N2) may be maintained at the reference voltage VREF. In addition, since the data input signal D_IN is maintained at a constant level, the phase control signal SIG_PC may also be maintained at a constant level.

The operation of the input buffer after time t707 may be substantially the same as the operation of the data IO buffer 380 during times t701 to t706.

Figure 8:
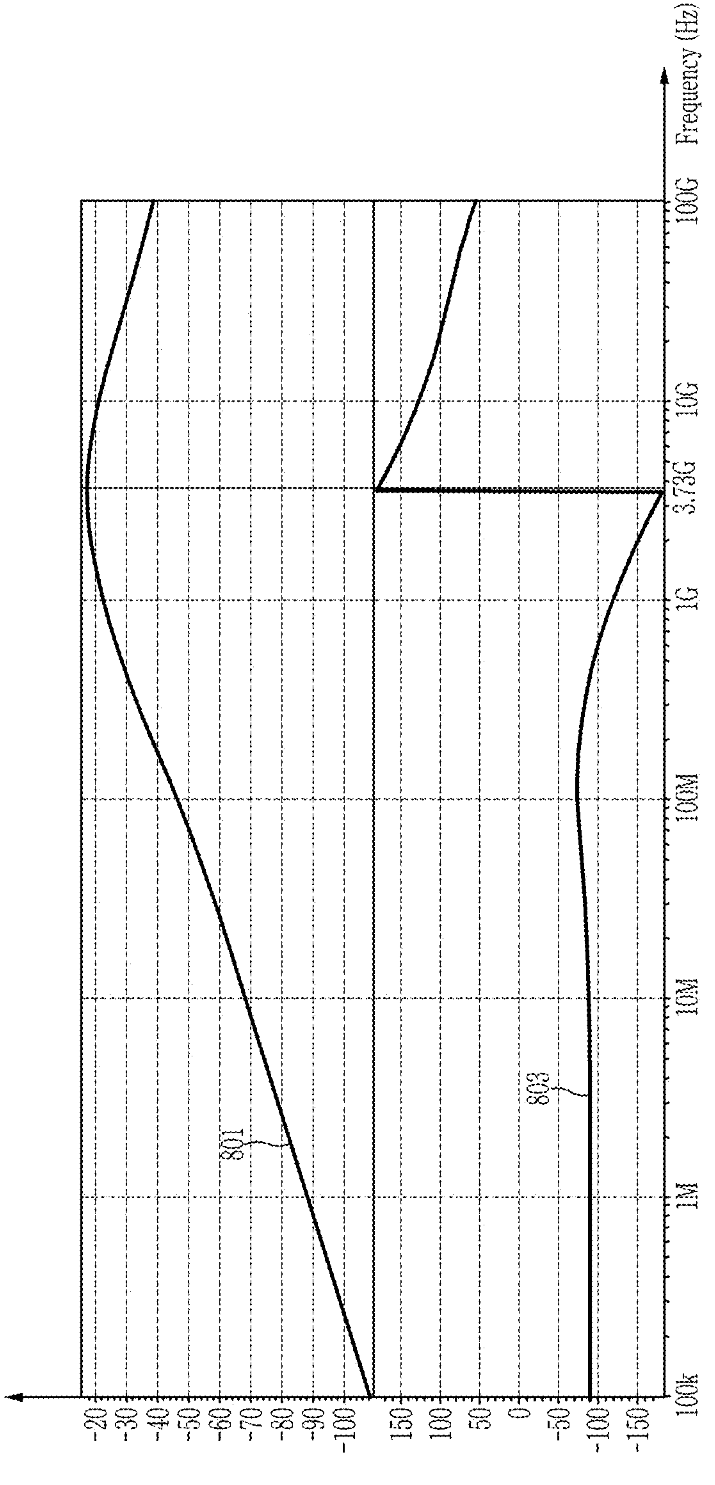
FIG. 8 is a graph illustrating AC magnitude and AC phase according to frequency.

FIG. 8 is a graph illustrating AC magnitude and AC phase according to frequency. Specifically, FIG. 8 is a graph illustrating the AC magnitude and AC phase when the memory device is double data rate 5 (DDR5). According to the DDR 5 standard, the memory devices may operate at a speed of 72 gigahertz (GHz). The memory device according to FIG. 8 may be designed to have maximum efficiency at the fastest frequency at which the memory device may operate, that is, at about a 3.7 GHZ clock.

A first graph 801 is a graph illustrating AC magnitude according to frequency. A second graph 803 is a graph illustrating AC phase according to frequency.

As illustrated in the first graph 801, as the frequency increases, the AC magnitude may gradually increase and then decrease after about 3.73 GHZ. In addition, as illustrated in the second graph 803, the AC phase is maintained at a constant level even if the frequency increases before about 3.73 GHZ, but the phase may be inverted based on about 3.73 GHZ. That is, at 3.73 GHZ, the memory device may have an AC phase of 180°.

Figure 9:
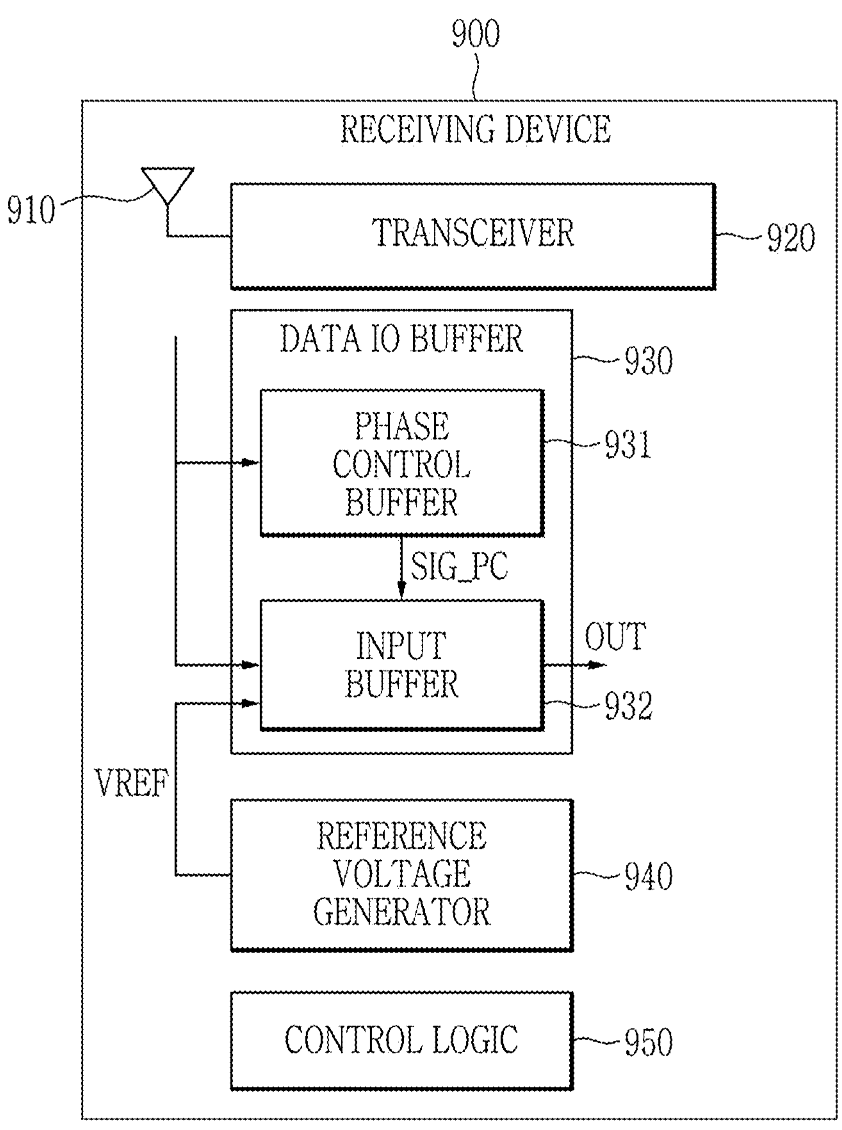
FIG. 9 is a diagram illustrating a receiving device according to an embodiment.

FIG. 9 is a diagram illustrating a receiving device according to an embodiment.

Referring to FIG. 9, the receiving device 900 includes a transceiver 920, a data IO buffer 930, a reference voltage generator 940, and control logic 950 (e.g., a logic circuit). The data IO buffer 930 may be implemented by the data IO buffer 380 of FIG. 5 or FIG. 6.

The transceiver 920 may transmit and receive a wireless signal through an antenna 910.

The reference voltage generator 940 may generate various voltages to drive the receiving device 900. The reference voltage generator 940 may receive a power supply voltage from outside and generate a reference voltage VREF based on the power supply voltage.

The data IO buffer 930 may process a signal received by the transceiver 920 and convert the signal into a signal that the control logic 950 may process. In an embodiment, the data IO buffer 930 includes a phase control buffer 931 and an input buffer 932.

The phase control buffer 931 may generate the phase control signal SIG_PC based on the signal received from the transceiver 920. In some embodiments, the phase control signal SIG_PC may be a signal having an opposite phase to the signal received from the transceiver 920. The phase control buffer 931 may transmit the generated phase control signal SIG_PC to the input buffer 932.

The input buffer 932 may receive the signal from the transceiver 920. The input buffer 932 may receive the reference voltage VREF from the reference voltage generator 940. The input buffer 932 may process the signal received from the transceiver 920 based on the reference voltage VREF. In an embodiment, the input buffer 932 converts the signal by comparing the reference voltage VREF and the data input signal D_IN. The input buffer 932 may transmit the converted signal as the output signal OUT to the control logic 950.

The control logic 950 may process the output signal OUT received from the data IO buffer 930. The control logic 950 may output the processed signal to the transceiver 920. The transceiver 920 may change the signal output from the control logic 950 into a wireless signal and transmit the changed wireless signal to an external device through the antenna 910.

Figure 10:
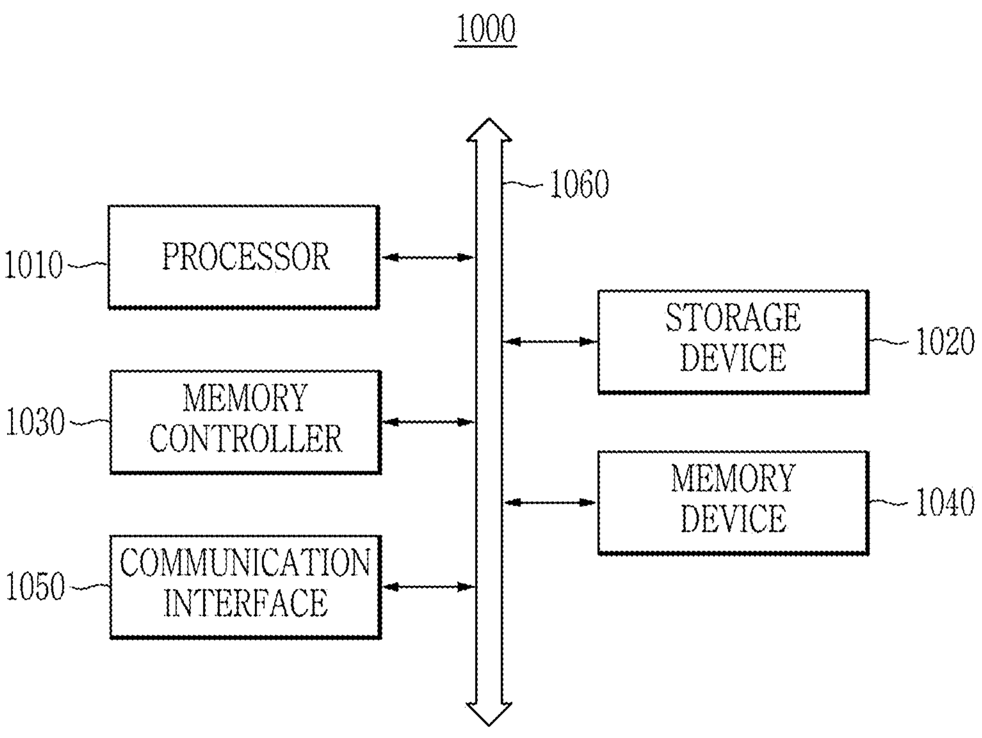
FIG. 10 is a block diagram illustrating a computing system according to an embodiment.

FIG. 10 is a block diagram illustrating a computing system according to an embodiment.

Referring to FIG. 10, a computing system 1000 includes a processor 1010, a memory device 1040, a memory controller 1030, a storage device 1020, a communication interface 1050, and a bus 1060. The computing system 1000 may further include other general-purpose components. In some embodiments, the computing system 1000 may be a vehicle-mounted data recording system provided in a vehicle.

The processor 1010 controls the overall operation of each component of the computing system 1000. The processor 1010 may be implemented as at least one of various processing units such as a central processing unit (CPU), an application processor (AP), and a graphic processing unit (GPU).

The memory device 1040 stores various data and commands. The memory controller 1030 controls transmission of data or commands to and from memory device 1040. In an embodiment, the memory controller 1030 may be provided as a separate chip from the processor 1010. In an embodiment, the memory controller 1030 may be provided as an internal component of the processor 1010. The memory device 1040 may be implemented as the memory device described with reference to FIGS. 1, 2, and 5 to 8.

In a non-optimized input buffer within a memory device, the reference voltage may be affected due to the parasitic capacitor between the node to which the reference voltage is input and the output node through which the output voltage is output. Accordingly, the memory device may not accurately detect the received signal due to the noise in the reference voltage.

However, the memory device 1040 according to an embodiment may generate a signal having an opposite phase to the input signal and feed back the signal having the opposite phase to the node to which the reference voltage is input. Accordingly, the memory device 1040 may cancel out the influence of the reference voltage by the output voltage. Accordingly, the memory device 1040 may accurately detect the received signal. In addition, the memory device 1040 may have an increased voltage gain in the high frequency domain by controlling the magnitude of the signal having the opposite phase and adding a high frequency AC current component to the reference voltage.

The storage device 1020 non-temporarily stores programs and data. In an embodiment, the communication interface 1050 supports wired and wireless Internet communication of the computing system 1000. In addition, the communication interface 1050 may support various communication methods other than the Internet communication. The bus 1060 provides a communication function between the components of the computing system 1000. The bus 1060 may include at least one type of bus depending on the communication protocol between the components.

Hereinabove, embodiments have been disclosed in the accompanying drawings and the specification. Although the embodiments have been described using specific terms in the present specification, these are used only for the purpose of explaining the technical spirit of the present disclosure and not used to limit the scope of the present disclosure described in the claims. Therefore, it will be understood by those skilled in the art that various modifications and equivalent other embodiments are possible therefrom.

What is claimed is:

1. A memory device, comprising:

a reference voltage generator configured to generate a reference voltage; and a data input/output (I/O) buffer configured to receive a data signal having a first phase, generate a phase control signal having a second phase opposite to the first phase during a transition of the data signal, and generate an output signal based on the data signal, the phase control signal, and the reference voltage.

2. The memory device of claim 1, wherein the data input/output buffer comprises:

an input buffer configured to receive the data signal and the phase control signal and generate the output signal by amplifying a difference between the reference voltage and the data signal; and a phase control buffer configured to receive the data signal and generate the phase control signal.

3. The memory device of claim 2, wherein the input buffer comprises:

a first node that receives the reference voltage;

a second node to output the output signal; and a third node receiving the data signal as input.

4. The memory device of claim 3, wherein a first input terminal of the phase control buffer is connected to the third node and an output terminal of the phase control buffer is connected to the first node.

5. The memory device of claim 3, wherein the input buffer comprises:

a fourth node that receives a power supply voltage and a bias voltage based on the reference voltage;

a first transistor including a gate connected to the third node;

a second transistor including a gate connected to the first node; and at least one transistor including a gate connected to the fourth node, and is connected in parallel to a drain of the first transistor and a drain of the second transistor, and the output signal is a node voltage corresponding to a current flowing in the second transistor.

6. The memory device of claim 5, wherein the phase control buffer comprises:

a third transistor including a gate connected to the third node; and a fourth transistor including a gate connected to the fourth node and a source connected to a drain of the third transistor, and the phase control signal is output through the source of the third transistor.

7. The memory device of claim 3, wherein the phase control signal is an alternating current (AC) voltage having a negative first voltage value in response to the data signal transitioning from a first level to a second level higher than the first level.

8. The memory device of claim 7, wherein the input buffer includes a parasitic capacitor located between the first node and the second node, the reference voltage has noise caused by the output signal due to the parasitic capacitor, and an absolute value of the first voltage value is greater than an absolute value of a magnitude of the noise.

9. The memory device of claim 3, wherein:

the phase control signal is an alternating current (AC) voltage having a positive second voltage value in response to the data signal transitioning from a second level to a first level lower than the second level.

10. The memory device of claim 9, wherein
the input buffer includes a parasitic capacitor located between the first node and the second node,
the reference voltage has noise caused by the output signal due to the parasitic capacitor, and
an absolute value of the second voltage value is greater than an absolute value of a magnitude of the noise.

11. A memory system, comprising:
a memory controller configured to transmit a data signal having a first phase; and
a memory device configured to receive the data signal, and generate an output signal corresponding to the data signal based on a reference voltage for detecting the data signal, a phase control signal having a second phase opposite to the first phase during a transition of the data signal, and the data signal.

12. The memory system of claim 11, wherein
the memory device comprises:
a first node that receives the reference voltage;
a second node to output the output signal;
a third node receiving the data signal as input;
a fourth node that receives a power supply voltage and a bias voltage based on the reference voltage;
a first transistor including a gate connected to the third node;
a second transistor including a gate connected to the first node; and
at least one transistor including a gate connected to the fourth node, and is connected in parallel to a drain of the first transistor and a drain of the second transistor, and
the output signal is a node voltage corresponding to a current flowing in the second transistor.

13. The memory system of claim 12, wherein
the memory device further comprises:
a third transistor including a gate connected to the third node; and
a fourth transistor including a gate connected to the fourth node, and a source connected to a drain of the third transistor, and
outputs the phase control signal through a source of the third transistor.

14. The memory system of claim 13, wherein
the memory device further comprises:
a phase capacitor that is connected between the source of the third transistor and the first node; and
a storage capacitor that is connected between a source of the fourth transistor and a ground.

15. The memory system of claim 12, wherein
the phase control signal is an alternating current (AC) voltage having a negative first voltage value in response to the data signal transitioning from a first level to a second level higher than the first level.

16. The memory system of claim 15, wherein
the memory device includes a parasitic capacitor located between the first node and the second node,
the reference voltage has noise caused by the output signal due to the parasitic capacitor, and
an absolute value of the first voltage value is greater than an absolute value of a magnitude of the noise.

17. The memory system of claim 12, wherein
the phase control signal is an alternating current (AC) voltage having a positive second voltage value in response to the data signal transitioning from a second level to a first level lower than the second level.

18. The memory system of claim 17, wherein
the memory device includes a parasitic capacitor located between the first node and the second node,
the reference voltage has noise caused by the output signal due to the parasitic capacitor, and
an absolute value of the second voltage value is greater than an absolute value of a magnitude of the noise.

19. A memory device, comprising:
a reference voltage generator configured to generate a reference voltage; and
a data input/output (I/O) buffer configured to receive the reference voltage through a first node, receive a data signal having a first phase through a third node, generate a phase control signal having a second phase opposite to the first phase during a transition of the data signal, generate an output signal by amplifying a difference between the reference voltage and the data signal, and output the output signal through a second node.

20. The memory device of claim 19, wherein
the data input/output buffer comprise:
a fourth node that receives a power supply voltage and a bias voltage based on the reference voltage;
a third transistor including a gate connected to the third node; and
a fourth transistor including a gate connected to the fourth node, and a source connected to a drain of the third transistor, and
the phase control signal is a signal output to the first node through the source of the third transistor.

* * * * *